US012622313B2

(12) United States Patent
We et al.

(10) Patent No.: US 12,622,313 B2
(45) Date of Patent: May 5, 2026

(54) METAL POCKET FANOUT PACKAGE

(71) Applicant: QUALCOMM Incorporated, San Diego, CA (US)

(72) Inventors: Hong Bok We, San Diego, CA (US); Joan Rey Villarba Buot, Escondido, CA (US); Sang-Jae Lee, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 431 days.

(21) Appl. No.: 18/063,384

(22) Filed: Dec. 8, 2022

(65) Prior Publication Data

US 2024/0194545 A1    Jun. 13, 2024

(51) Int. Cl.
| | |
|---|---|
| *H10W 76/17* | (2026.01) |
| *H10W 72/00* | (2026.01) |
| *H10W 74/01* | (2026.01) |
| *H10W 74/10* | (2026.01) |
| *H10W 70/09* | (2026.01) |
| *H10W 70/60* | (2026.01) |
| *H10W 70/652* | (2026.01) |

(52) U.S. Cl.
CPC ......... *H10W 76/17* (2026.01); *H10W 72/071* (2026.01); *H10W 74/01* (2026.01); *H10W 74/121* (2026.01); *H10W 70/09* (2026.01); *H10W 70/60* (2026.01); *H10W 70/6528* (2026.01)

(58) Field of Classification Search
CPC ......... H01L 23/06; H01L 21/52; H01L 21/56; H01L 23/3135; H01L 24/19; H01L 24/24; H01L 2224/19; H01L 2224/24011; H01L 2224/244

See application file for complete search history.

(56) References Cited

U.S. PATENT DOCUMENTS

| | | | |
|---|---|---|---|
| 2011/0298109 A1* | 12/2011 | Pagaila | H01L 24/19 |
| | | | 257/E23.114 |
| 2017/0018510 A1 | 1/2017 | Shen et al. | |
| 2019/0096821 A1* | 3/2019 | Chiang | H01L 23/3135 |
| 2019/0348371 A1* | 11/2019 | Fang | H01L 23/552 |
| 2020/0118949 A1 | 4/2020 | Moallem et al. | |
| 2020/0203313 A1* | 6/2020 | Chen | H01L 24/32 |
| 2020/0312783 A1* | 10/2020 | Min | H01L 23/49822 |
| 2021/0111094 A1 | 4/2021 | Kim et al. | |
| 2021/0358823 A1 | 11/2021 | Tseng et al. | |
| 2023/0056509 A1* | 2/2023 | Rajoo | H10D 1/20 |

OTHER PUBLICATIONS

International Search Report and Written Opinion—PCT/US2023/080982—ISA/EPO—Apr. 4, 2024.

* cited by examiner

*Primary Examiner* — Jacob Y Choi
*Assistant Examiner* — Neil R Prasad
(74) *Attorney, Agent, or Firm* — Muncy, Geissler, Olds & Lowe, P.C.

(57) ABSTRACT

Disclosed are examples of die packages that incorporate metal frames with metal pockets. One or more dies may be placed within the metal pockets. Due to the structural integrity provided by the metal frame, warpage is reduced or eliminated. As a result, die packages with thin dies may be fabricated. Further, due to the electrical conductivity provided by the metal frame, the metal frame may be used as an electrical shield to protect the dies.

20 Claims, 14 Drawing Sheets

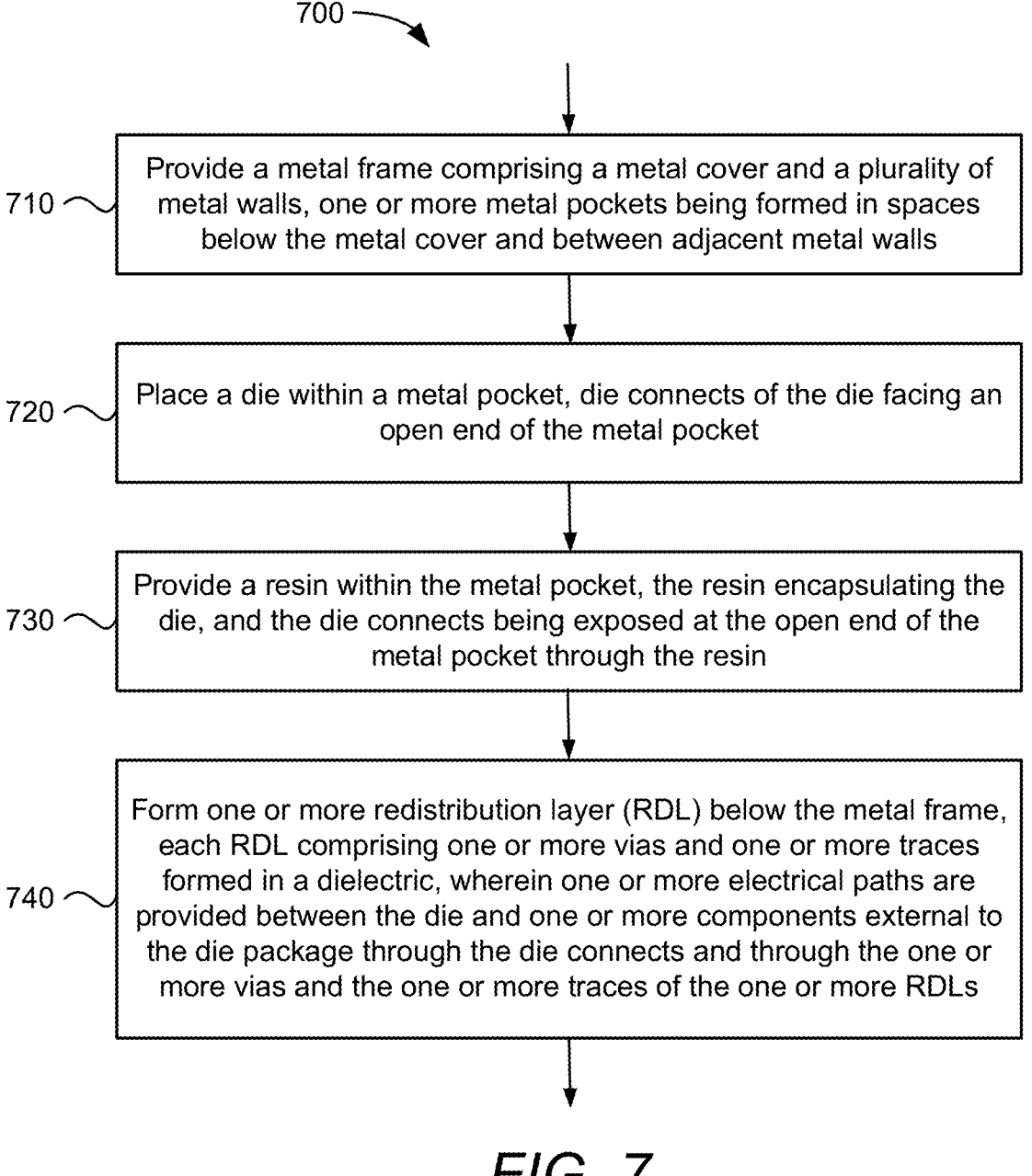

700 —

710 — Provide a metal frame comprising a metal cover and a plurality of metal walls, one or more metal pockets being formed in spaces below the metal cover and between adjacent metal walls 720 — Place a die within a metal pocket, die connects of the die facing an open end of the metal pocket 730 — Provide a resin within the metal pocket, the resin encapsulating the die, and the die connects being exposed at the open end of the metal pocket through the resin 740 — Form one or more redistribution layer (RDL) below the metal frame, each RDL comprising one or more vias and one or more traces formed in a dielectric, wherein one or more electrical paths are provided between the die and one or more components external to the die package through the die connects and through the one or more vias and the one or more traces of the one or more RDLs

*FIG. 7*

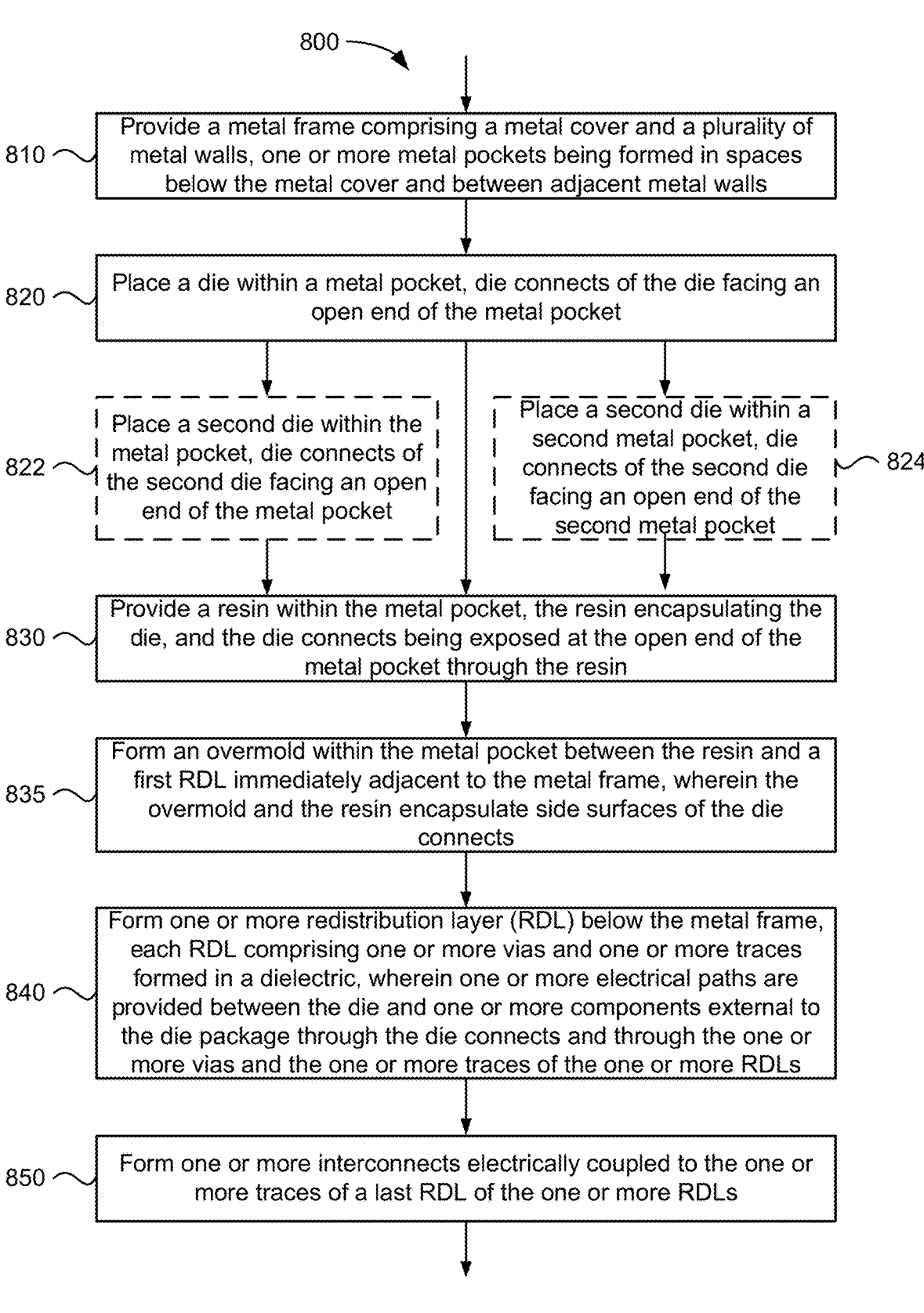

800 —

810 — Provide a metal frame comprising a metal cover and a plurality of metal walls, one or more metal pockets being formed in spaces below the metal cover and between adjacent metal walls 820 — Place a die within a metal pocket, die connects of the die facing an open end of the metal pocket 822 — Place a second die within the metal pocket, die connects of the second die facing an open end of the metal pocket 824 — Place a second die within a second metal pocket, die connects of the second die facing an open end of the second metal pocket 830 — Provide a resin within the metal pocket, the resin encapsulating the die, and the die connects being exposed at the open end of the metal pocket through the resin 835 — Form an overmold within the metal pocket between the resin and a first RDL immediately adjacent to the metal frame, wherein the overmold and the resin encapsulate side surfaces of the die connects 840 — Form one or more redistribution layer (RDL) below the metal frame, each RDL comprising one or more vias and one or more traces formed in a dielectric, wherein one or more electrical paths are provided between the die and one or more components external to the die package through the die connects and through the one or more vias and the one or more traces of the one or more RDLs 850 — Form one or more interconnects electrically coupled to the one or more traces of a last RDL of the one or more RDLs

*FIG. 8*

METAL POCKET FANOUT PACKAGE

FIELD OF DISCLOSURE

This disclosure relates generally to die packages, and more specifically, but not exclusively, to metal pocket fanout packages and fabrication techniques thereof.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

Fanout package has a fundamental problem if the body size goes larger. Thus, it becomes hard to use a thin die for fanout package or single large die package due to mechanical stability considerations.

Accordingly, there is a need for systems, apparatus, and methods that overcome the deficiencies of conventional die packages including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary die package is disclosed. The die package may comprise a metal frame, which may comprise a metal cover and a plurality of metal walls. One or more metal pockets may be formed in spaces below the metal cover and between adjacent metal walls. The die package may also comprise a die within a metal pocket. Die connects of the die may face an open end of the metal pocket. The die package may further comprise a resin within the metal pocket. The resin may encapsulate the die. The die connects may be exposed at the open end of the metal pocket through the resin. The die package may yet comprise one or more redistribution layers (RDL) below the metal frame. Each RDL may comprise one or more vias and one or more traces formed in a dielectric. One or more electrical paths may be provided between the die and one or more components external to the die package through the die connects and through the one or more vias and the one or more traces of the one or more RDLs.

A method of fabricating an exemplary die package is disclosed. The method may comprise providing a metal frame, which may comprise a metal cover and a plurality of metal walls. One or more metal pockets may be formed in spaces below the metal cover and between adjacent metal walls. The method may also comprise placing a die within a metal pocket. Die connects of the die may face an open end of the metal pocket. The method may further comprise providing a resin within the metal pocket. The resin may encapsulate the die. The die connects may be exposed at the open end of the metal pocket through the resin. The method may yet comprise forming one or more redistribution layers (RDL) below the metal frame. Each RDL may comprise one or more vias and one or more traces formed in a dielectric. One or more electrical paths may be provided between the die and one or more components external to the die package through the die connects and through the one or more vias and the one or more traces of the one or more RDLs.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 6A-6K illustrate examples of stages of fabricating die packages in accordance with one or more aspects of the disclosure.

FIGS. 7-8 illustrate flow charts of example methods of manufacturing a die package in accordance with one or more aspects of the disclosure.

Figure 1:
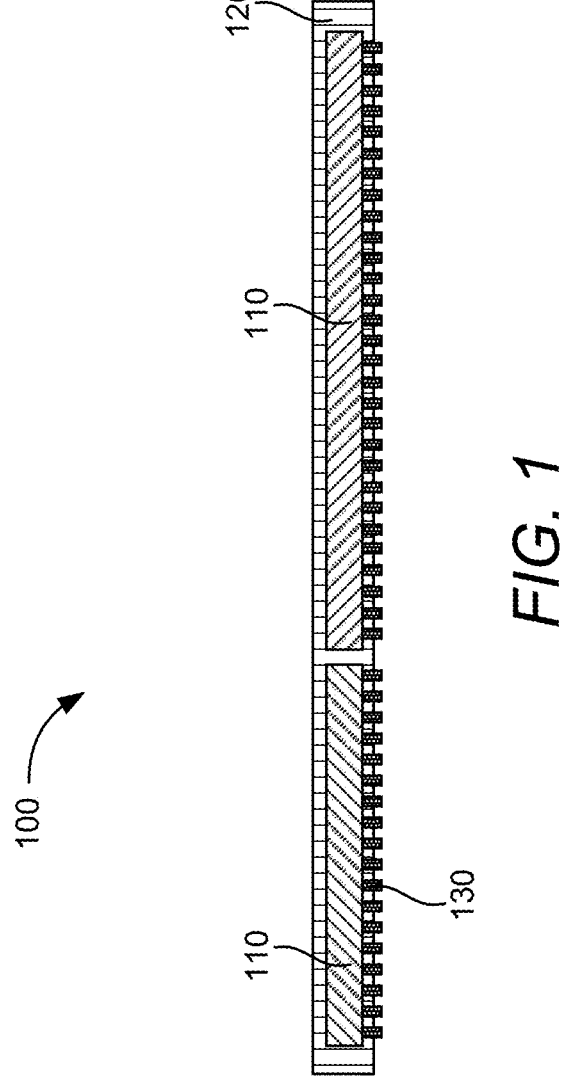
FIGS. 1 and 2 illustrates examples of conventional die packages.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising." "includes," and/or "including." when used herein, specify the presence of stated features, integers, steps, operations, elements, and/or components, but do not preclude the presence or addition of one or more other features, integers, steps, operations, elements, components, and/or groups thereof.

As indicated above, fanout package has a fundamental problem if the body size goes larger. Normally, fanout package is not big. Big body size with molding compound with redistribution layer (RDL) technology results in worse/significant warpages. Thus, it becomes hard to use a thin die for fanout package or single large die package due to mechanical stability considerations.

For multi-die package application or large die package applications, tight warpage control is needed. Multi-die package and large die packages need fine line and space (L/S) with thermal solution. However, typical substrate does not have fine L/S capability. Also, RDL package does not have thermal solution with thin package. RDL normal thickness is about 7 μm, and has limited thermal dissipation capacity. Footprint wise, die packages require thickness for stiffness, but this can be undesirable for thermal control.

FIG. 1 illustrates an example of a conventional die package 100, in this instance is an example of a fanout compound die package. The die package 100 includes multiple dies 110 (two in this example) in a mold compound 120. A redistribution layer 130 enables connection between the dies 110 and components external to the die package.

Figure 2:
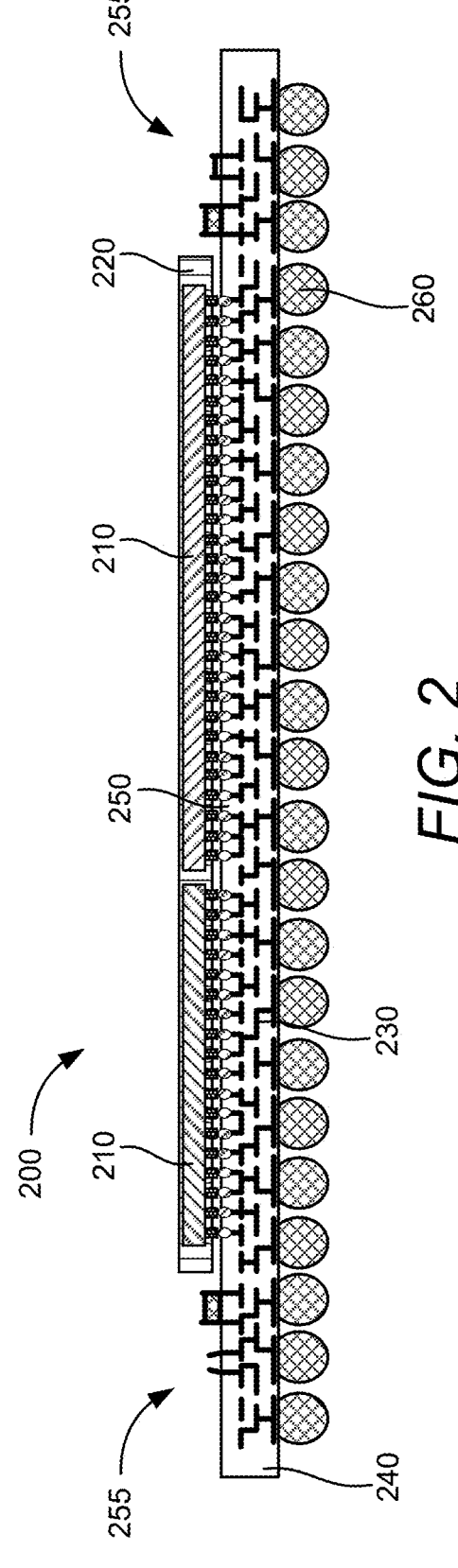

FIG. 2 illustrates another example of a conventional package 200. In this instance, the package 200 is an example of a fanout hybrid ball grid array (BGA) package. As seen, the package 200 includes multiple dies 210 in a mold compound 220 on a substrate 240 with RDL 230. Interposer 250 is between the dies 210 and the substrate 240. Solder balls 260 forming the BGA are attached to the lower surface of the substrate 240. The solder balls 260 are electrically coupled to the dies 210 through the RDL 230 and the interposer 250.

In both instances, the dies 110, 210 are very thick, e.g., in excess of 300 μm. Also, multi-die substrate packages require keep-out-zones (KOZ) 255 and require other thermal regulation solutions. Thus, the overall packages 100, 200 are large and thick.

In accordance with the various aspects disclosed herein, to address issues associated with conventional die packages, it is proposed to use metal frames with dies placed in pockets with thermally cured resin/dielectric material. The metal frame may act as a stiffner and as a heat sink. The metal frame may further act as an electrical shield. RDLs may be placed on the die connects (e.g., microbumps, pillars) and the metal frame at once. Some of the vias may connect with the metal frame to form heat transit path. The metal pocket can help to release heat within the die fanout package. As a result, thermal regulation may be achieved. Metal pockets can mechanically support the packaging process to ensure that warpage is reduced or even eliminated. Carrier is NOT necessary for the packaging process. Due to the mechanical stability of the metal pockets, thin dies (e.g., thickness of 100 μm or less) may be utilized in multi-die package or in large die package with fanout technology.

Figure 3:
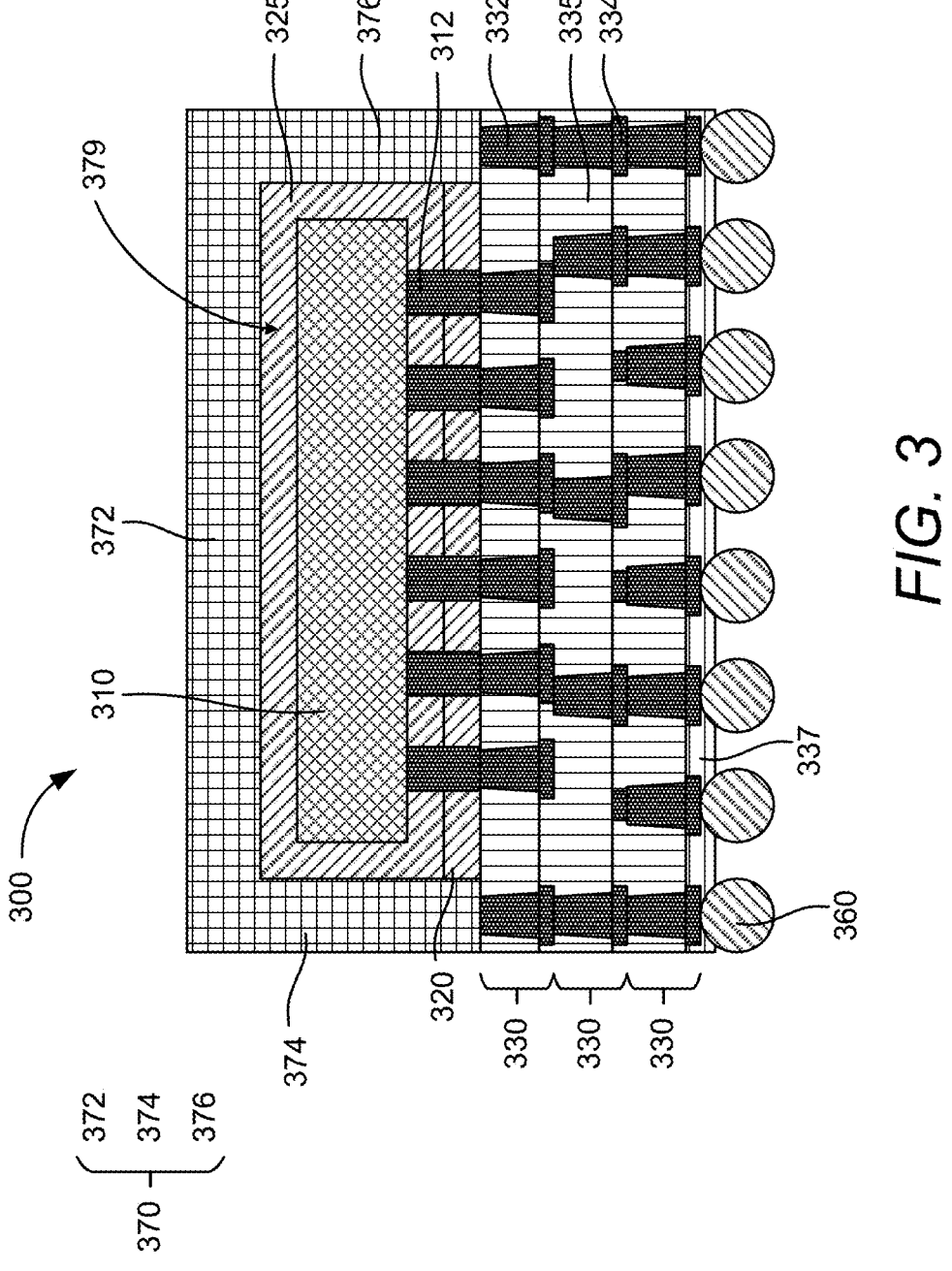
FIGS. 3-5 illustrate examples of die packages in accordance with one or more aspects of the disclosure.

FIG. 3 illustrates an example of a die package 300 in accordance with one or more aspects of the disclosure. The die package 300 is an example of a single pocket, single die package. As seen, the die package 300 may comprise a metal frame 370 with a metal cover 372 and a plurality of metal walls 374, 376. For ease of reference, the metal wall 374 may be referred to as a first (or left) metal wall, and metal wall 376 may be referred to as a second (or right) metal wall. A metal pocket 379 may be formed in a space below the metal cover 372 and between adjacent metal walls, which are first and second metal walls 374, 376 in this instance. Before proceeding further, it should be noted that terms such as top, bottom, upper, lower, left, right, etc. are used for ease of description. Unless specifically stated otherwise, these terms should not be taken to mean absolute orientations.

The metal frame 370 may be preformed. For example, a metal piece may be stamped to shape the metal piece into the metal frame 370 including the metal cover 372 and the plurality of walls 374, 376 to thereby form the metal pocket 379. The metal frame 370 may be formed from one or more metals including tungsten (W), aluminum (Al), copper (Cu), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), ruthenium (Ru).

A die 310 may be placed within the metal pocket 379. Die connects 312 (e.g., pillars, microbumps) of the die 310 may face an open end of the metal pocket 379. For example, the die 310 may be a flipchip die. A resin 325 may be provided within the metal pocket 379. In an aspect, the resin 325 may be thermally cured dielectric. The resin 325 may encapsulate the die 310. The die connects 312 may be exposed at the open end of the metal pocket 379 through the resin 325.

An overmold 320 may be formed within the metal pocket 379. The overmold 320 and the resin 325 may encapsulate side surfaces of the die connects 312. In an aspect, lower surfaces the plurality of metal walls 374, 376, lower surfaces of the die connects 312, and a lower surface of the overmold 320 may be planar. Note that the lower surface of the die connects 312 may remain exposed at the open end of the metal pocket 379.

One or more redistribution layers (RDL) 330 may be formed below the metal frame 370. Each RDL 330 may comprise one or more vias 332 and one or more traces or lines 334 formed in a dielectric 335. In an aspect, the vias 332 and/or the traces 334 may be formed from metals including copper (Cu). Electrical paths may be provided may be provided between the die 310 and one or more components external to the die package 300 through the die connects 312 of the die 310 and through the one or more vias 332 and the one or more traces 334 of the one or more RDLs 330.

For case of reference, the RDL 330 immediately adjacent to, i.e., closest to, the metal frame 370 may be referred to as the first RDL. Conversely, the RDL 330 furthest from the metal frame 370 may be referred to as the last RDL. Thus, if there is only one RDL 330, the single RDL 330 would be both first and last RDL. When there are multiple RDLs 330, they may be stacked.

The die package 300 may further include a passivation layer 337 on a lower surface of the last RDL 330, and include one or more interconnects 360 (e.g., solder balls, BGA, etc.) electrically coupled to the one or more traces 334 of the last RDL 330 through the passivation layer 337. For example, the interconnects 360 may be in physical contact.

Thus, electrical paths may be provided between the die 310 and the one or more interconnects 360 through the die connects 312 of the die 310 and through the one or more vias 332 and the one or more traces 334 of the one or more RDLs 330.

One more of the vias 332 of the first RDL 330 may be in physical contact with the metal frame 370. In FIG. 3, it is illustrated that two vias 332 are in contact with the metal walls 374, 376. Also, the RDLs 330 may be configured such that an electrical path may be provided between at least one interconnect 360 and the metal frame 370 through the vias 332 and the traces 334 of the RDLs 330. For example, if the metal frame 370 is electrically coupled to power or ground voltage, the metal frame 370 may act as an electrical shield. Alternatively or in addition thereto, a thermal path may be provided between at least one interconnect 360 and the metal frame 370 through the vias 332 and the traces 334 of the RDLs 330. In so doing, thermal regulation may be enabled that much more.

Note that due to the mechanical support provided by the metal frame 370, warpage may be reduced or even eliminated. As such, thin dies may be used. For example, the thickness of the die 310 may be low, e.g., 100 μm or even thinner.

Figure 4:
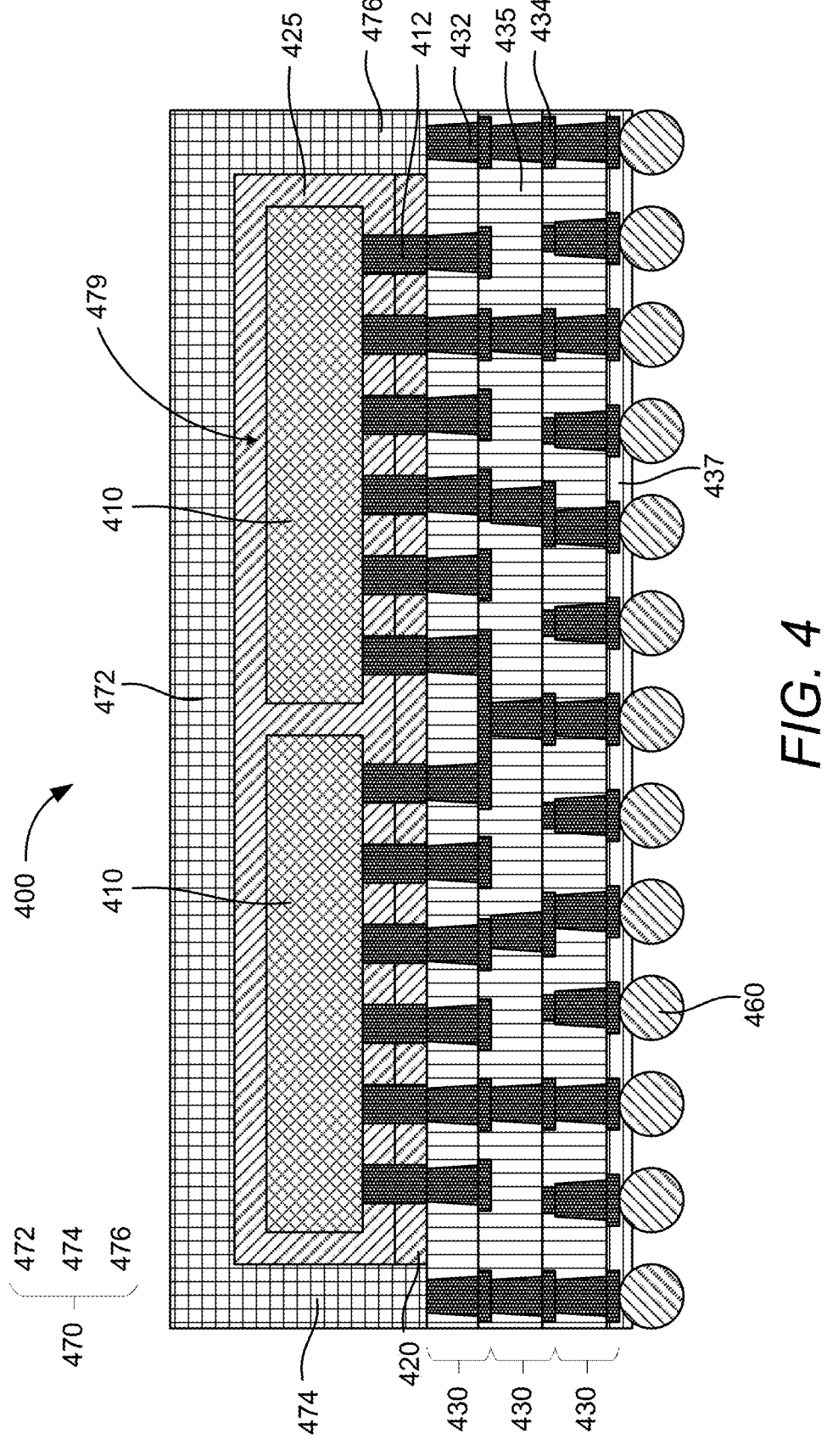

FIG. 4 illustrates another example of a die package 400 in accordance with one or more aspects of the disclosure. The die package 400 is an example of a single pocket, multi-die package. The die package 400 may be similar to the die package 300 of FIG. 3. One difference is that there can be multiple dies in the metal pocket of the die package 400.

As seen, the die package 400 may comprise a metal frame 470 with a metal cover 472 and a plurality of metal walls 474, 476. For ease of reference, the metal wall 474 may be referred to as a first (or left) metal wall, and the metal wall 476 may be referred to as a second (or right) metal wall. A metal pocket 479 may be formed in a space below the metal cover 472 and between adjacent metal walls 474, 476.

Multiple dies 410 may be placed within the metal pocket 479. In FIG. 4, two dies 410 are illustrated. For example, the die 410 on the left may be referred to as the first die and the die 410 on the right may be referred to as the second die. Note that any number of dies may be placed in the metal pocket 479. One or both of the dies 410 may be thin—e.g., thickness may be 100 μm or even thinner.

A resin 425 may be provided within the metal pocket 479. In an aspect, the resin 425 may be thermally cured dielectric. The resin 425 may encapsulate the first and second dies 410. Die connects 412 of one or both of the first and second dies 410 may be exposed at the open end of the metal pocket 479 through the resin 425.

An overmold 420 may be formed within the metal pocket 479. The overmold 420 and the resin 425 may encapsulate side surfaces of the die connects 412 of the first and second dies 410. Lower surfaces the plurality of metal walls 474, 476, lower surfaces of the die connects 412, and a lower surface of the overmold 420 may be planar.

One or more redistribution layers (RDL) 430 may be formed below the metal frame 470. Each RDL 430 may comprise one or more vias 432 and one or more traces or lines 434 formed in a dielectric 435. A passivation layer 437 may be formed on a lower surface of the last RDL 430.

The die package 400 may also include one or more interconnects 460 electrically coupled (e.g., through physical contact) to the one or more traces 434 of the last RDL 430 through the passivation layer 437. Electrical paths may be provided may be provided between the first and second dies 410 and one or more components external to the die package 400 through the die connects 412 of the first and second dies 410, through the one or more vias 432 and the one or more traces 434 of the one or more RDLs 430, and through the one or more interconnects 460.

One more of the vias 432 of the first RDL 430 may be in physical contact with the metal frame 470. The RDLs 330 may be configured such that an electrical path and/or a thermal path may be provided between at least one interconnect 460 and the metal frame 470 through the vias 432 and the traces 434 of the RDLs 430.

Figure 5:
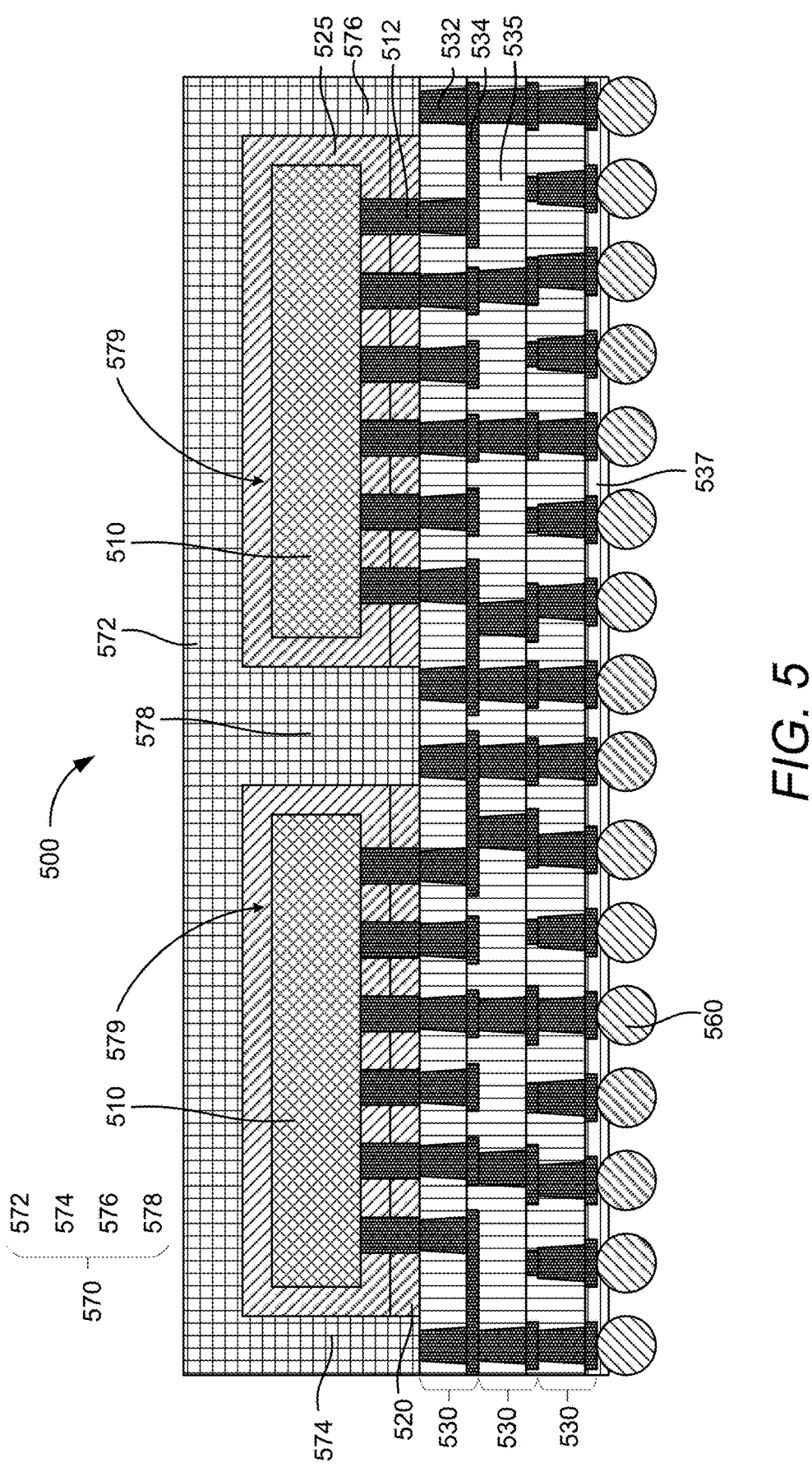

FIG. 5 illustrates a further example of a die package 500 in accordance with one or more aspects of the disclosure. The die package 500 is an example of a multi-pocket, multi-die package. The die package 500 may be similar to the die package 300 of FIG. 5. One difference is that there can be multiple metal pockets formed in a single metal frame.

As seen, the die package 500 may comprise a metal frame 570 with a metal cover 572 and a plurality of metal walls 574, 576, 578. For ease of reference, the metal wall 574 may be referred to as a first (or left) metal wall, the metal wall 576 may be referred to as a second (or right) metal wall, and the metal wall 578 may be referred to as a third (or middle) metal. The left metal pocket 579 formed between the first and third metal walls 574, 578 may be referred to as a first metal pocket, and the right metal pocket 579 formed between the third and second metal walls 578, 576 may be referred to as a second metal pocket. It should be noted that any number of metal pockets may be formed in a metal frame.

In FIG. 5, it is illustrated that one die 510 is placed in each metal pocket 579. That is, FIG. 5 shows a first die 510 being placed within the first metal pocket 579, and a second die 510 being placed within the second metal pocket 579. However, it should be noted that any number of dies 510 may be placed within each metal pocket 579. One or both of the dies 510 may be thin—e.g., thickness may be 100 μm or even thinner.

Resin 525 may be provided within the first and second metal pockets 579. The resin 525 may be thermally cured dielectric, and may encapsulate the first and second dies 510 within each of the first and second metal pockets 579. Die connects 512 of one or both of the first and second dies 510 may be exposed at the open end of their respective metal pockets 579 through the resin 525.

An overmold 520 may be formed within the first and second metal pockets 579. The overmold 520 and the resin 525 may encapsulate side surfaces of the die connects 512 of the first and second dies 510. Lower surfaces the plurality of metal walls 574, 576, 578, lower surfaces of the die connects 512, and a lower surface of the overmold 520 may be planar.

One or more redistribution layers (RDL) 530 may be formed below the metal frame 570. Each RDL 530 may comprise one or more vias 532 and one or more traces or lines 534 formed in a dielectric 535. A passivation layer 537 may be formed on a lower surface of the last RDL 530.

The die package 500 may also include one or more interconnects 560 electrically coupled (e.g., through physical contact) to the one or more traces 534 of the last RDL 530 through the passivation layer 537. Electrical paths may be provided may be provided between the first and second dies 510 and one or more components external to the die package 500 through the die connects 512 of the first and second dies 510, through the one or more vias 532 and the one or more traces 534 of the one or more RDLs 530, and through the one or more interconnects 560.

While not specifically illustrated, different variations of the die packages are also contemplated. For example, a metal frame may comprise one or more metal pockets. Within each metal pocket, there may be one or more dies. Moreover, the dies may be thin. Also, there may be one or more RDLs.

FIGS. 6A-6K illustrate example stages of fabricating a die package in accordance with one or more aspects of the disclosure. In these figures, fabrication stages related to the die package 500 are illustrated.

Figures 6A, 6B:
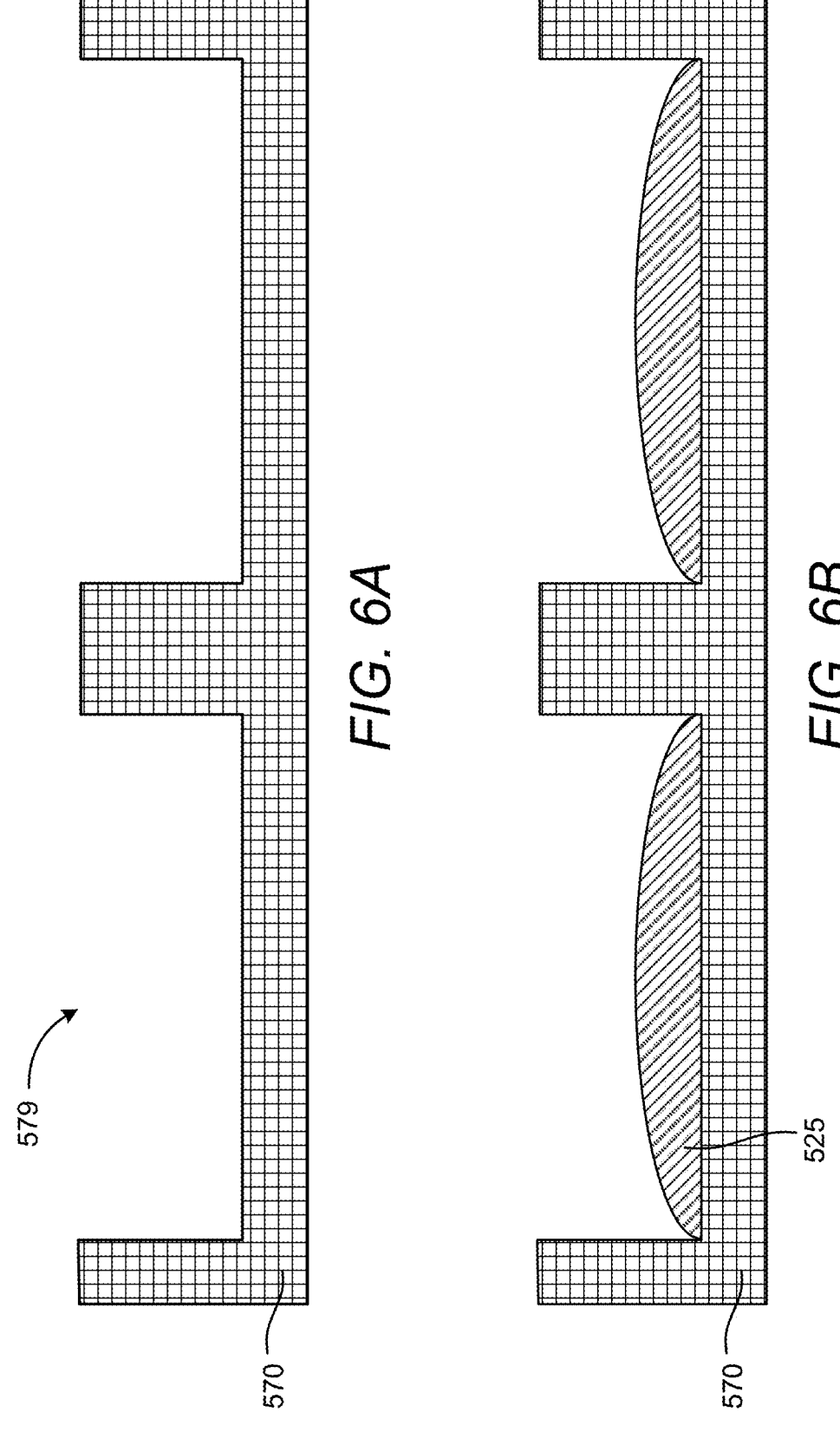

FIG. 6A illustrates a stage in which a metal frame 570 may be provided. The metal frame 570 may be preformed with the metal pockets 579.

FIG. 6B illustrates a stage in which the resin 525 in soft form may be dispensed in the metal pockets 579.

Figures 6C, 6D:
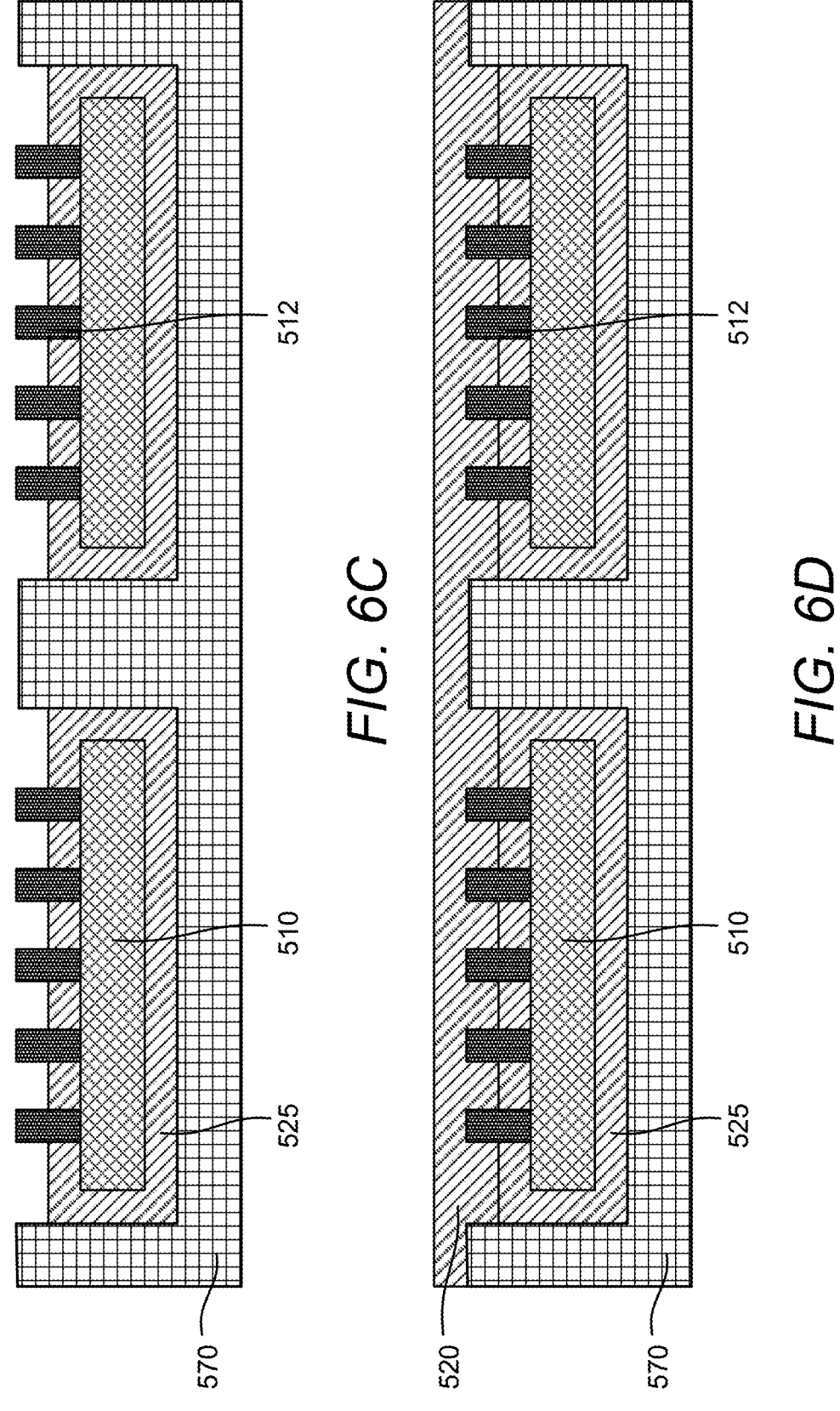

FIG. 6C illustrates a stage in which the dies 510 may be placed in the metal pockets 579 on the resin 525. The resin 525 may then be hardened, e.g., through a thermal curing process. In an aspect, the resin 525 need not completely fill the metal pockets 579.

FIG. 6D illustrates a stage in which the overmold 520 may be deposited on the metal frame 570, the resin 525, and the die connects 512. The deposited overmold 520 may overfill the metal pockets 579.

Figures 6E, 6F:
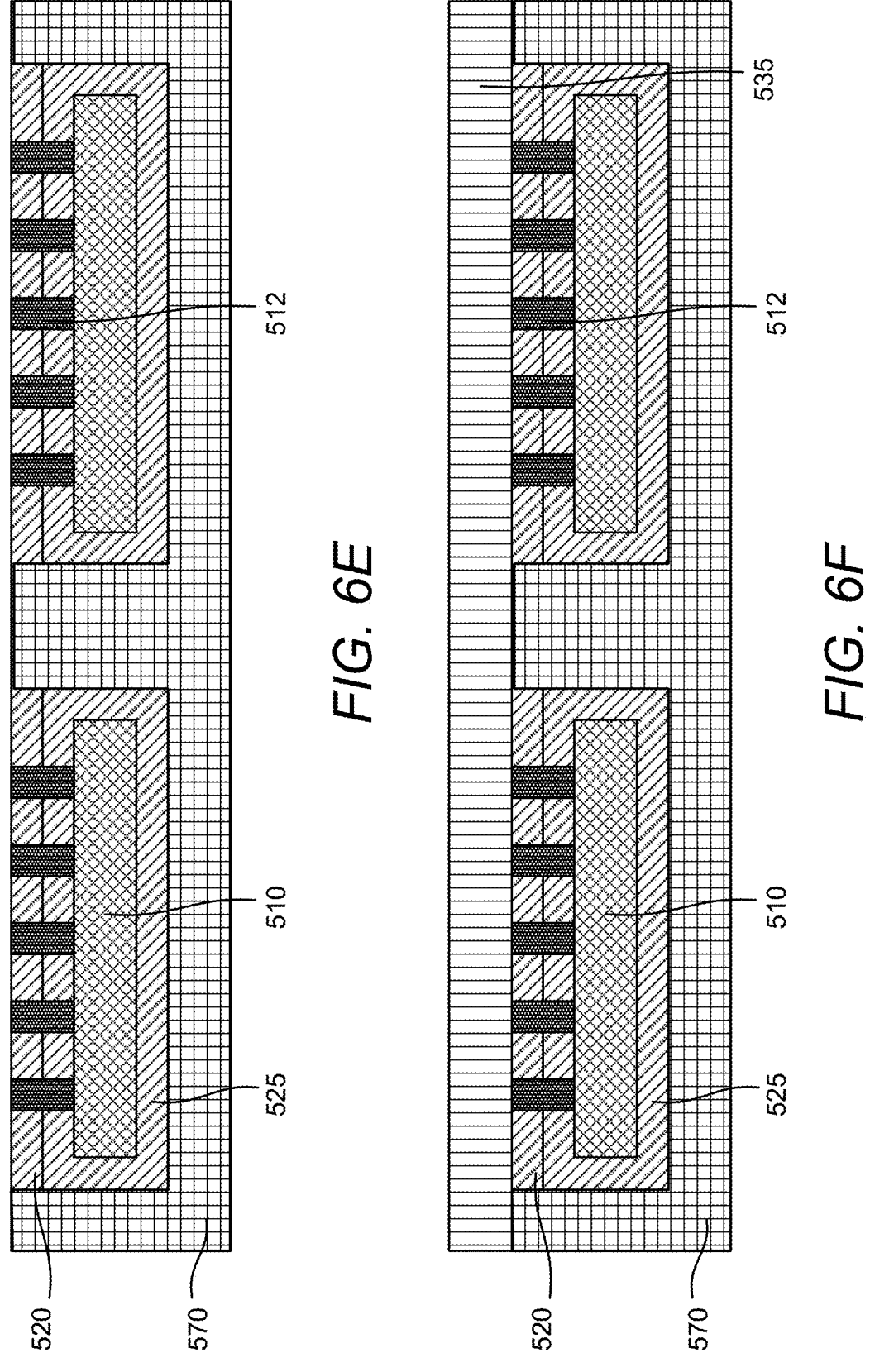

FIG. 6E illustrates a stage in which the overmold 520 may be grinded such that the surfaces of the metal walls 574, 576, 578 (not numbered in FIG. 6E), the overmold 520, and the die connects 512 are planar.

FIG. 6F illustrates a stage in which the dielectric 535 for the first RDL 530 (not numbered in FIG. 6F) is deposited.

Figures 6G, 6H:
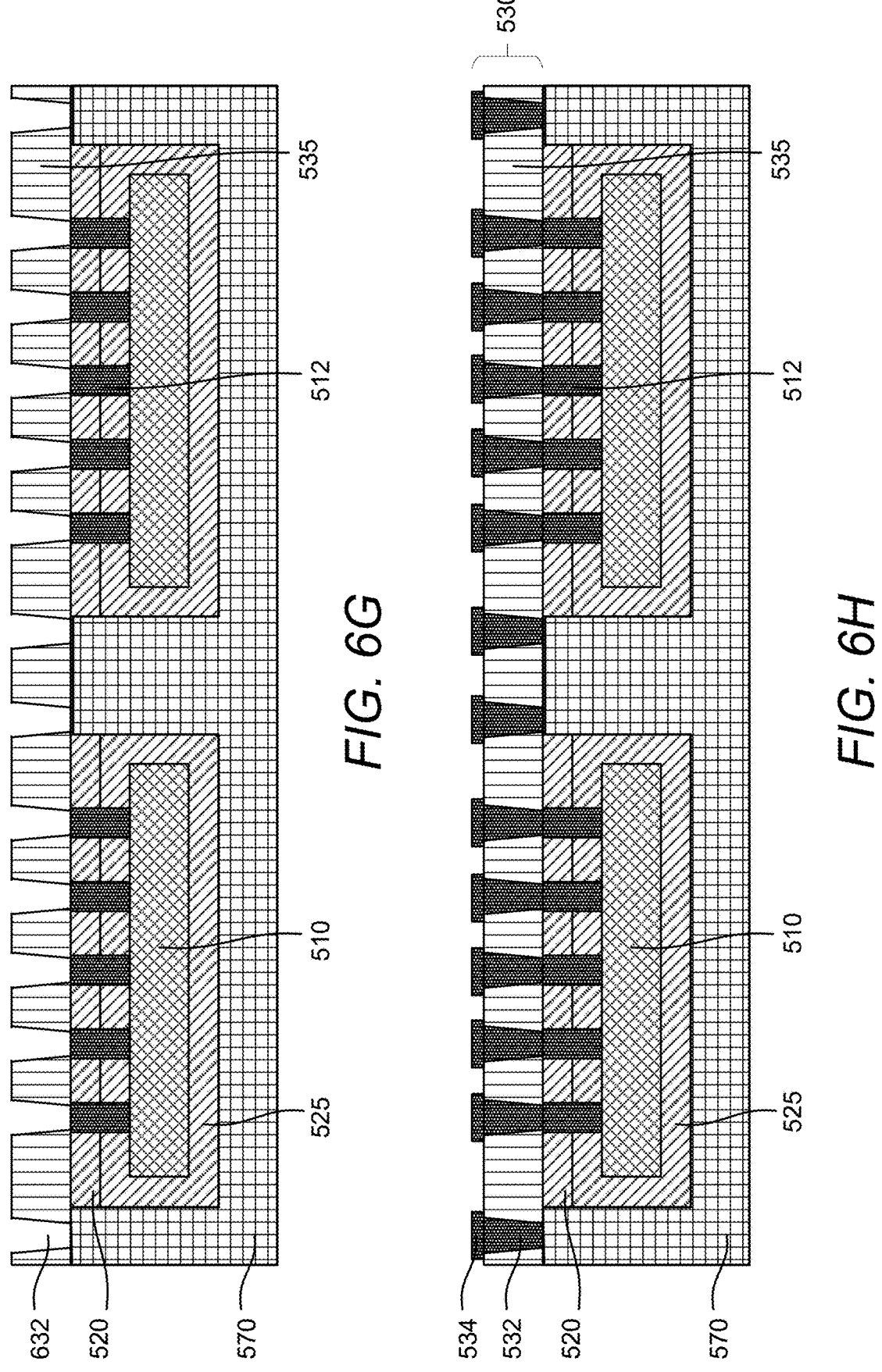

FIG. 6G illustrates a stage in which one or more via holes 632 (e.g., through photoresist masking) may be etched in the dielectric 535.

FIG. 6H illustrates a stage in which the via holes 632 are filled (e.g., with Cu) to form the vias 532 of the first RDL 530. Then traces 534 may be formed.

Figures 6I, 6J:
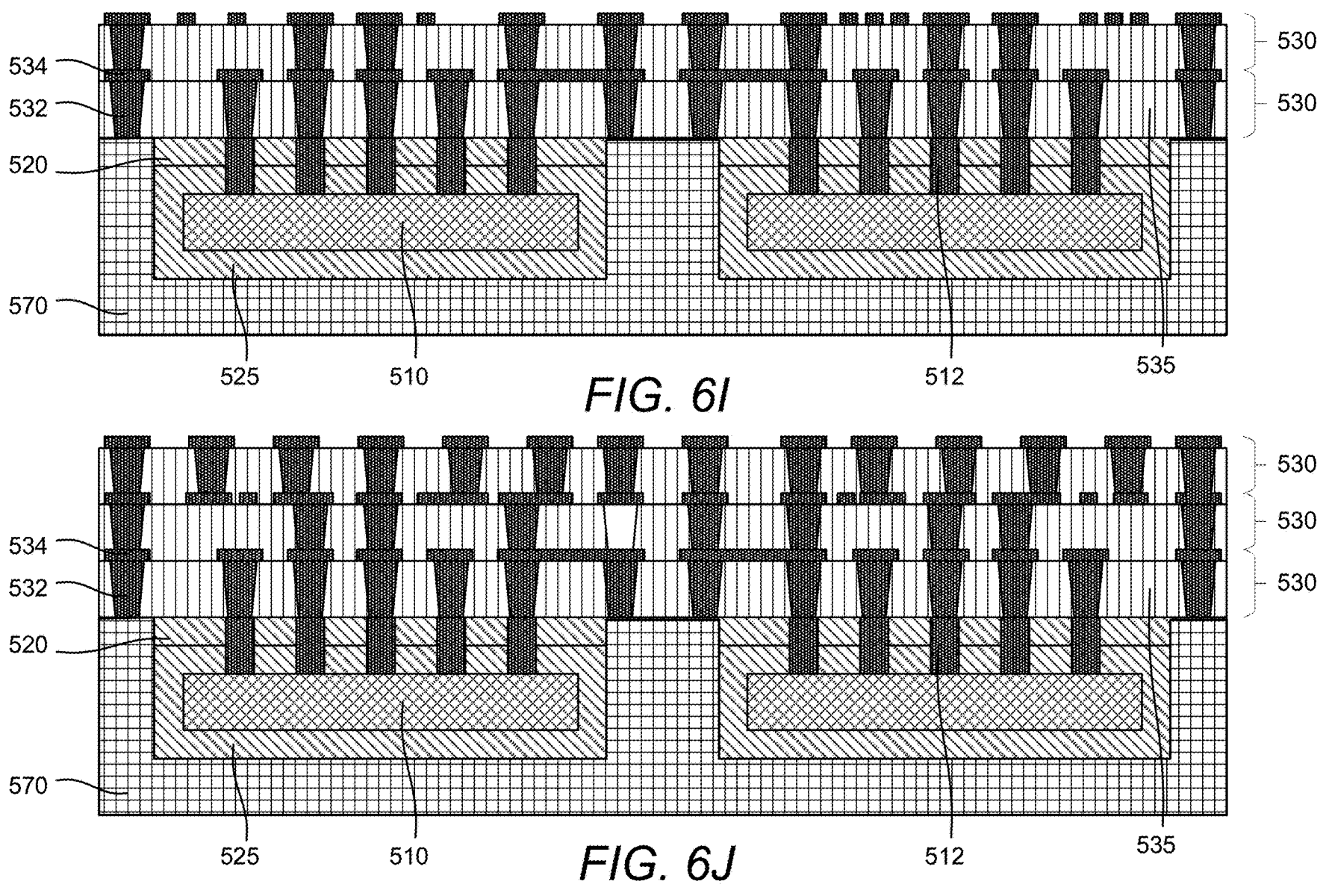

FIG. 6I illustrates a stage in which a second RDL 530 may be formed, e.g., by following the processes illustrated in FIGS. 6F-6H on the first RDL 530.

Similarly, FIG. 6J illustrates a stage in which a third RDL 530 may be formed, e.g., by following the processes illustrated in FIGS. 6F-6H on the second RDL 530. In this instance, the third RDL 530 is the last RDL. But it should be noted that in general, the processes illustrated FIGS. 6F-6H may be performed any number of times.

Figure 6K:
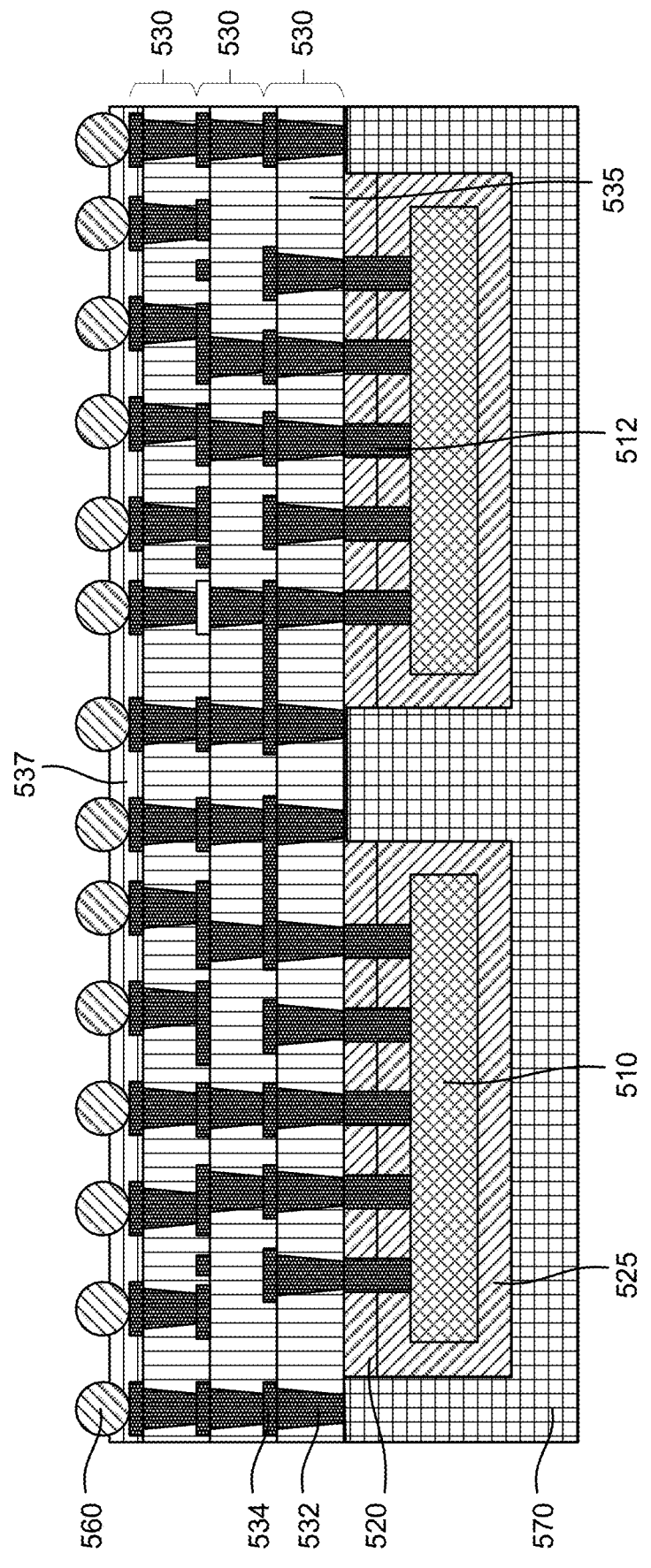

FIG. 6K illustrates a stage in which the passivation layer 537 is formed and the interconnects 560 are mounted. Thereafter, the die package 500 may be singulated.

While FIGS. 6A-6K illustrate stages of fabricating the die package 500, one of ordinary skill would find it straight forward to adjust the fabrication processes to arrive at die packages 300 and 400 and any variation thereof. Note that the die packaging process does NOT require conventional carriers to be used.

FIG. 7 illustrates a flow chart of an example method 700 of fabricating a die package, such as die packages 300, 400 and 500 in accordance with one or more aspects of the disclosure.

In block 710, a metal frame may be provided. The metal frame may comprise a metal cover, and a plurality of metal walls. A metal pocket may be formed in a space below the metal cover and between adjacent metal walls. In an aspect, block 710 may correspond to the stage illustrated in FIG. 6A.

In block 720, a die may be placed within the metal pocket. The die connects of the die may face an open end of the metal pocket. In an aspect, block 720 may correspond to the stage illustrated in FIG. 6C.

In block 730, a resin may be provided within the metal pocket. The resin may encapsulate the die. The die connects may be exposed at the open end of the metal pocket through the resin. In an aspect, block 730 may correspond to the stages illustrated in FIGS. 6B and 6C.

In block 740, one or more redistribution layers (RDL) may be formed below the metal frame. Each RDL may comprise one or more vias and one or more traces formed in a dielectric. One or more electrical paths may be provided between the die and one or more components external to the die package through the die connects and through the one or more vias and the one or more traces of the one or more RDLs. In an aspect, block 740 may correspond to the stages illustrated in FIGS. 6F-6J.

FIG. 8 illustrates a flow chart of an example method 800 of fabricating a die package, such as die packages 300, 400 and 500 in accordance with one or more aspects of the disclosure. FIG. 8 may be viewed as being more comprehensive than FIG. 7.

Block 810 is similar to block 710. That is, in block 810, a metal frame may be provided. The metal frame may comprise a metal cover, and a plurality of metal walls. A metal pocket may be formed in a space below the metal cover and between adjacent metal walls. In an aspect, block 810 may correspond to the stage illustrated in FIG. 6A.

Block 820 is similar to block 720. That is, in block 820, a die may be placed within the metal pocket. The die connects of the die may face an open end of the metal pocket. In an aspect, block 820 may correspond to the stage illustrated in FIG. 6C.

From block 820, the method may proceed to block 822, which may be relevant to fabricating the die package 400 of FIG. 4. Thus, the die referred to in blocks 810 and 820 may be assumed to be a first die. In block 822, a second die may be placed within the metal pocket adjacent to the first die. The second die may also be encapsulated by the resin. Also, the die connects of the second die may face the open end of the metal pocket. While not specifically shown, block 822 may correspond to the stage illustrated in FIG. 6C with there being two dies in the metal pocket.

Alternatively, from block 820, the method may proceed to block 824, which may be relevant to fabricating the die package 500 of FIG. 5. Thus, the metal pocket and the die referred to in blocks 810 and 820 may be assumed to be a first metal pocket and a first die, respectively. In block 824, a second die may be placed within a second metal pocket. The second die may also be encapsulated by the resin. Also, the die connects of the second die may face the open end of the metal pocket. In an aspect, block 824 may correspond to the stage illustrated in FIG. 6C.

Block 830 is similar to block 730. That is, in block 830, a resin may be provided within the metal pocket. The resin may encapsulate the die. The die connects may be exposed at the open end of the metal pocket through the resin. Note that if the die package is a multi-die package (e.g., die packages 400, 500), then the resin may encapsulate the multiple dies. In an aspect, block 830 may correspond to the stages illustrated in FIGS. 6B and 6C.

In block 835, an overmold may be formed within the metal pocket between the resin and the first RDL, which may be the RDL that is immediately adjacent to the metal frame. The overmold and the resin may encapsulate side surfaces of the die connects. In an aspect, block 835 may correspond to the stages illustrated in FIGS. 6D and 6E.

Block 840 is similar to block 740. That is, in block 840, one or more redistribution layers (RDL) may be formed below the metal frame. Each RDL may comprise one or more vias and one or more traces formed in a dielectric. One or more electrical paths may be provided between the die and one or more components external to the die package through the die connects and through the one or more vias and the one or more traces of the one or more RDLs. In an aspect, block 840 may correspond to the stages illustrated in FIGS. 6F-6J.

In block 850, one or more interconnects may be formed. The one or more interconnects may be electrically coupled to the one or more traces of the last RDL, which may be the RDL furthest from the metal frame. In an aspect, block 850 may correspond to the stage illustrated in FIG. 6K.

Figure 9:
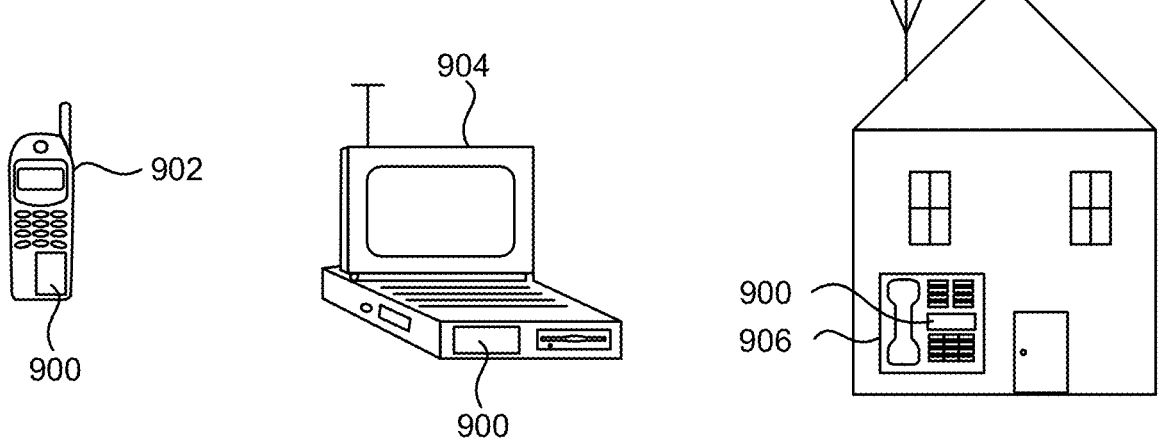
FIG. 9 illustrates various electronic devices which may utilize one or more aspects of the disclosure.

FIG. 9 illustrates various electronic devices 900 that may be integrated with any of the aforementioned die packages in accordance with various aspects of the disclosure. For example, a mobile phone device 902, a laptop computer device 904, and a fixed location terminal device 906 may each be considered generally user equipment (UE) and may include one or more die packages (e.g., die packages 300, 400, 500) as described herein. The devices 902, 904, 906 illustrated in FIG. 9 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IOT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A die package, comprising: a metal frame comprising a metal cover and a plurality of metal walls, one or more metal pockets being formed in spaces below the metal cover and between adjacent metal walls; a die within a metal pocket, die connects of the die facing an open end of the metal pocket; a resin within the metal pocket, the resin encapsulating the die, and the die connects being exposed at the open end of the metal pocket through the resin; and one or more redistribution layers (RDL) below the metal frame, each RDL comprising one or more vias and one or more traces formed in a dielectric, wherein one or more electrical paths are provided between the die and one or more components external to the die package through the die connects and through the one or more vias and the one or more traces of the one or more RDLs.

Clause 2: The die package of clause 1, further comprising: one or more interconnects electrically coupled to the one or more traces of a last RDL, the last RDL being an RDL furthest from the metal frame, wherein one or more electrical paths are provided between the die and the one or more interconnects through the die connects and through the one or more vias and the one or more traces of the one or more RDLs.

Clause 3: The die package of clause 2, wherein an electrical path, a thermal path, or both are provided between at least one interconnect and the metal frame through at least one via of each of the one or more RDLs.

Clause 4: The die package of any of clauses 1-3, further comprising: an overmold within the metal pocket between the resin and a first RDL immediately adjacent to the metal frame, wherein the overmold and the resin encapsulate side surfaces of the die connects.

Clause 5: The die package of clause 4, wherein lower surfaces of the plurality of metal walls, lower surfaces of the die connects, and a lower surface of the overmold are in physical contact with an upper surface of the first RDL.

Clause 6: The die package of any of clauses 1-5, wherein at least one via of a first RDL is in physical contact with the metal frame, the first RDL being an RDL immediately adjacent to the metal frame.

Clause 7: The die package of any of clauses 1-6, wherein the metal frame is electrically coupled to power or to ground voltage.

Clause 8: The die package of any of clauses 1-7, wherein the die is a first die, wherein the die package further comprises a second die within the metal pocket adjacent to the first die, the second die also being encapsulated by the resin, die connects of the second die facing the open end of the metal pocket, and wherein one or more electrical paths are provided between the second die and the one or more components external to the die package through the die connects of the second die and through the one or more vias and the one or more traces of the one or more RDLs.

Clause 9: The die package of any of clauses 1-8, wherein the metal pocket is a first metal pocket formed in a space below the metal cover and between a first pair of adjacent metal walls, and the die is a first die within the first metal pocket, wherein a second metal pocket is formed in a space below the metal cover and between another pair of adjacent metal walls, wherein the die package further comprises a second die within the second metal pocket, the second die also being encapsulated by the resin, die connects of the second die facing an open end of the second metal pocket, and wherein one or more electrical paths are provided between the second die and one or more components external to the die package through the die connects of the second die and through the one or more vias and the one or more traces of the one or more RDLs.

Clause 10: The die package of any of clauses 1-9, wherein the die package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

Clause 11: A method of fabricating a die package, the method comprising: providing a metal frame comprising a metal cover and a plurality of metal walls, a metal pocket being formed in a space below the metal cover and between adjacent metal walls; placing a die within the metal pocket, die connects of the die facing an open end of the metal pocket; providing a resin within the metal pocket, the resin encapsulating the die, and the die connects being exposed at the open end of the metal pocket through the resin; and forming one or more redistribution layers (RDL) below the metal frame, each RDL comprising one or more vias and one or more traces formed in a dielectric, wherein one or more electrical paths are provided between the die and one or more components external to the die package through the die connects and through the one or more vias and the one or more traces of the one or more RDLs.

Clause 12: The method of clause 11, forming one or more interconnects electrically coupled to the one or more traces of a last RDL, the last RDL being an RDL furthest from the metal frame, wherein one or more electrical paths are provided between the die and the one or more interconnects through the die connects and through the one or more vias and the one or more traces of the one or more RDLs.

Clause 13: The method of clause 12, wherein an electrical path, a thermal path, or both are provided between at least one interconnect and the metal frame through at least one via of each of the one or more RDLs.

Clause 14: The method of any of clauses 11-13, further comprising: forming an overmold within the metal pocket between the resin and a first RDL immediately adjacent to the metal frame, wherein the overmold and the resin encapsulate side surfaces of the die connects.

Clause 15: The method of clause 14, wherein lower surfaces of the adjacent metal walls, lower surfaces of the die connects, and a lower surface of the overmold are in physical contact with an upper surface of the first RDL.

Clause 16: The method of any of clauses 11-15, wherein at least one via of a first RDL is in physical contact with the metal frame, the first RDL being an RDL immediately adjacent to the metal frame.

Clause 17: The method of any of clauses 11-16, wherein the metal frame is electrically coupled to power or to ground voltage.

Clause 18: The method of any of clauses 11-17, wherein the die is a first die, wherein the method further comprises placing a second die within the metal pocket adjacent to the first die, the second die also being encapsulated by the resin, die connects of the second die facing the open end of the metal pocket, and wherein one or more electrical paths are provided between the second die and the one or more components external to the die package through the die connects of the second die and through the one or more vias and the one or more traces of the one or more RDLs.

Clause 19: The method of any of clauses 11-18, wherein the metal pocket is a first metal pocket formed in a space below the metal cover and between a first pair of adjacent metal walls, and the die is a first die within the first metal pocket, wherein a second metal pocket is formed in a space below the metal cover and between another pair of adjacent metal walls, wherein the method further comprises placing a second die within the second metal pocket, the second die also being encapsulated by the resin, die connects of the second die facing an open end of the second metal pocket, and wherein one or more electrical paths are provided between the second die and one or more components external to the die package through the die connects of the second die and through the one or more vias and the one or more traces of the one or more RDLs.

Clause 20: The method of any of clauses 11-19, wherein no carrier is used in fabrication of the die package.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A die package, comprising:
a metal frame comprising a metal cover and a plurality of metal walls, a metal pocket being formed in spaces below the metal cover and between adjacent metal walls;
a die within the metal pocket, die connects of the die facing an open end of the metal pocket;
a resin within the metal pocket, the resin encapsulating the die, and the die connects being exposed at the open end of the metal pocket through the resin, wherein the resin is in between the metal cover and the die, and wherein the resin covers all of a lower surface of the die other than portions covered by the die connects; and
one or more redistribution layers (RDL) below the metal frame, each RDL comprising one or more vias and one or more traces formed in a dielectric,
wherein one or more electrical paths are provided between the die and one or more components external to the die package through the die connects and through the one or more vias and the one or more traces of the one or more RDLs, and
wherein a lower surface of the resin is above lower surfaces of the plurality of metal walls.

2. The die package of claim 1, further comprising:
one or more interconnects electrically coupled to the one or more traces of a last RDL, the last RDL being an RDL furthest from the metal frame,
wherein one or more electrical paths are provided between the die and the one or more interconnects through the die connects and through the one or more vias and the one or more traces of the one or more RDLs.

3. The die package of claim 2, wherein an electrical path, a thermal path, or both are provided between at least one interconnect and the metal frame through at least one via of each of the one or more RDLs.

4. The die package of claim 1, further comprising:
an overmold within the metal pocket between the resin and a first RDL immediately adjacent to the metal frame,
wherein the overmold and the resin encapsulate side surfaces of the die connects.

5. The die package of claim 4, wherein lower surfaces of the plurality of metal walls, lower surfaces of the die connects, and a lower surface of the overmold are in physical contact with an upper surface of the first RDL.

6. The die package of claim 1, wherein at least one via of a first RDL is in physical contact with the metal frame, the first RDL being an RDL immediately adjacent to the metal frame.

7. The die package of claim 1, wherein the metal frame is electrically coupled to power or to ground voltage.

8. The die package of claim 1, wherein the die is a first die, wherein the die package further comprises a second die within the metal pocket adjacent to the first die, the second die also being encapsulated by the resin, die connects of the second die facing the open end of the metal pocket, and wherein one or more electrical paths are provided between the second die and the one or more components external to the die package through the die connects of the second die and through the one or more vias and the one or more traces of the one or more RDLs.

9. The die package of claim 1, wherein the metal pocket is a first metal pocket formed in a space below the metal cover and between a first pair of adjacent metal walls, and the die is a first die within the first metal pocket, wherein a second metal pocket is formed in a space below the metal cover and between a second pair of adjacent metal walls, wherein the die package further comprises a second die within the second metal pocket, the second die also being encapsulated by the resin, die connects of the second die facing an open end of the second metal pocket, and wherein one or more electrical paths are provided between the second die and one or more components external to the die package through the die connects of the second die and through the one or more vias and the one or more traces of the one or more RDLs.

10. The die package of claim 1, wherein the die package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

11. A method of fabricating a die package, the method comprising:

providing a metal frame comprising a metal cover and a plurality of metal walls, a metal pocket being formed in a space below the metal cover and between adjacent metal walls;

placing a die within the metal pocket, die connects of the die facing an open end of the metal pocket;

providing a resin within the metal pocket, the resin encapsulating the die, and the die connects being exposed at the open end of the metal pocket through the resin, wherein the resin is in between the metal cover and the die, and wherein the resin covers all of a lower surface of the die other than portions covered by the die connects; and forming one or more redistribution layers (RDL) below the metal frame, each RDL comprising one or more vias and one or more traces formed in a dielectric, wherein one or more electrical paths are provided between the die and one or more components external to the die package through the die connects and through the one or more vias and the one or more traces of the one or more RDLs, and wherein a lower surface of the resin is above lower surfaces of the plurality of metal walls.

12. The method of claim 11, further comprising:

forming one or more interconnects electrically coupled to the one or more traces of a last RDL, the last RDL being an RDL furthest from the metal frame, wherein one or more electrical paths are provided between the die and the one or more interconnects through the die connects and through the one or more vias and the one or more traces of the one or more RDLs.

13. The method of claim 12, wherein an electrical path, a thermal path, or both are provided between at least one interconnect and the metal frame through at least one via of each of the one or more RDLs.

14. The method of claim 11, further comprising:

forming an overmold within the metal pocket between the resin and a first RDL immediately adjacent to the metal frame, wherein the overmold and the resin encapsulate side surfaces of the die connects.

15. The method of claim 14, wherein lower surfaces of the adjacent metal walls, lower surfaces of the die connects, and a lower surface of the overmold are in physical contact with an upper surface of the first RDL.

16. The method of claim 11, wherein at least one via of a first RDL is in physical contact with the metal frame, the first RDL being an RDL immediately adjacent to the metal frame.

17. The method of claim 11, wherein the metal frame is electrically coupled to power or to ground voltage.

18. The method of claim 11, wherein the die is a first die, wherein the method further comprises placing a second die within the metal pocket adjacent to the first die, the second die also being encapsulated by the resin, die connects of the second die facing the open end of the metal pocket, and wherein one or more electrical paths are provided between the second die and the one or more components external to the die package through the die connects of the second die and through the one or more vias and the one or more traces of the one or more RDLs.

19. The method of claim 11, wherein the metal pocket is a first metal pocket formed in a space below the metal cover and between a first pair of adjacent metal walls, and the die is a first die within the first metal pocket, wherein a second metal pocket is formed in a space below the metal cover and between a second pair of adjacent metal walls, wherein the method further comprises placing a second die within the second metal pocket, the second die also being encapsulated by the resin, die connects of the second die facing an open end of the second metal pocket, and wherein one or more electrical paths are provided between the second die and one or more components external to the die package through the die connects of the second die and through the one or more vias and the one or more traces of the one or more RDLs.

20. The method of claim 11, wherein no carrier is used in fabrication of the die package.

* * * * *